(12) United States Patent
Goda

(10) Patent No.: US 10,090,310 B2
(45) Date of Patent: *Oct. 2, 2018

(54) MEMORY DEVICES HAVING SELECT GATES WITH P TYPE BODIES, MEMORY STRINGS HAVING SEPARATE SOURCE LINES AND METHODS

(71) Applicant: Micron Technology, Inc., Boise, ID (US)

(72) Inventor: Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 70 days.

This patent is subject to a terminal disclaimer.

(21) Appl. No.: 14/456,479

(22) Filed: Aug. 11, 2014

(65) Prior Publication Data

US 2014/0347934 A1 Nov. 27, 2014

Related U.S. Application Data

(62) Division of application No. 14/159,238, filed on Jan. 20, 2014, now Pat. No. 8,804,416, which is a division
(Continued)

(51) Int. Cl.
*G11C 16/04* (2006.01)
*H01L 27/115* (2017.01)
(Continued)

(52) U.S. Cl.
CPC .............. *H01L 27/115* (2013.01); *G11C 7/00* (2013.01); *G11C 16/0466* (2013.01); *G11C 16/0483* (2013.01); *G11C 16/10* (2013.01); *G11C 16/26* (2013.01); *H01L 27/11556* (2013.01); *H01L 27/11582* (2013.01); *H01L 29/78* (2013.01); *H01L 29/7889* (2013.01);
(Continued)

(58) Field of Classification Search
CPC . G11C 16/0466; G11C 16/0483; G11C 16/10; G11C 16/26; G11C 7/00
See application file for complete search history.

(56) References Cited

U.S. PATENT DOCUMENTS 5,321,699 A 6/1994 Endoh et al.
5,581,504 A * 12/1996 Chang ................ G11C 16/0483
365/185.17
(Continued)

FOREIGN PATENT DOCUMENTS

TW 201234530 A 8/2012
WO WO-2012075024 A2 6/2012
WO WO-2012075024 A3 6/2012

OTHER PUBLICATIONS

US 8,406,047, 03/2013, Goda (withdrawn)
(Continued)

*Primary Examiner* — Khamdan Alrobaie
(74) *Attorney, Agent, or Firm* — Schwegman Lundberg & Woessner, P.A.

(57) ABSTRACT

Memory devices and methods of operating memory devices are shown. Configurations described include a memory cell string having an elongated n type body region and having select gates with p type bodies. Configurations and methods shown can provide a reliable bias to a body region for memory operations such as erasing.

19 Claims, 7 Drawing Sheets

Related U.S. Application Data of application No. 13/850,043, filed on Mar. 25, 2013, now Pat. No. 8,634,222, which is a division of application No. 12/955,448, filed on Nov. 29, 2010, now Pat. No. 8,514,620.

(51) Int. Cl.

| | | |
|---|---|---|
| *H01L 27/11556* | (2017.01) | |
| *H01L 27/11582* | (2017.01) | |
| *H01L 29/788* | (2006.01) | |
| *H01L 29/792* | (2006.01) | |
| *G11C 7/00* | (2006.01) | |
| *H01L 29/78* | (2006.01) | |
| *G11C 16/10* | (2006.01) | |
| *G11C 16/26* | (2006.01) | |
| *H01L 27/11519* | (2017.01) | |
| *H01L 27/11524* | (2017.01) | |
| *H01L 27/11565* | (2017.01) | |
| *H01L 27/1157* | (2017.01) | |

(52) U.S. Cl.
CPC ...... *H01L 29/7926* (2013.01); *H01L 27/1157* (2013.01); *H01L 27/11519* (2013.01); *H01L 27/11524* (2013.01); *H01L 27/11565* (2013.01)

(56) References Cited

U.S. PATENT DOCUMENTS

| | | | |
|---|---|---|---|
| 5,844,842 A | 12/1998 | Seki et al. | |
| 5,917,752 A | 6/1999 | Seki et al. | |
| 6,278,964 B1 | 8/2001 | Fang et al. | |
| 6,353,242 B1* | 3/2002 | Watanabe | G11C 16/0483 |
| | | | 257/208 |
| 6,828,689 B2 | 12/2004 | Madurawe | |
| 7,256,447 B2 | 8/2007 | Park et al. | |
| 7,701,780 B2 | 4/2010 | Mihnea et al. | |
| 7,768,838 B2 | 8/2010 | Aritome | |
| 7,916,543 B2 | 3/2011 | Goda et al. | |
| 8,116,137 B2 | 2/2012 | Goda et al. | |
| 8,238,170 B2 | 8/2012 | Mihnea et al. | |
| 8,427,880 B2 | 4/2013 | Aritome et al. | |
| 8,514,620 B2 | 8/2013 | Goda | |
| 8,634,222 B2 | 1/2014 | Goda | |
| 8,804,416 B2 | 8/2014 | Goda et al. | |
| 2003/0053349 A1* | 3/2003 | Thomas | G11C 17/18 |
| | | | 365/200 |
| 2008/0298123 A1 | 12/2008 | Mihnea et al. | |
| 2009/0103371 A1* | 4/2009 | Goda | G11C 16/3468 |
| | | | 365/185.29 |
| 2009/0109759 A1 | 4/2009 | Aritome | |
| 2010/0072538 A1 | 3/2010 | Kito et al. | |
| 2010/0097862 A1* | 4/2010 | Kang | G11C 16/0483 |
| | | | 365/185.17 |
| 2010/0118610 A1 | 5/2010 | Katsumata et al. | |
| 2010/0159657 A1* | 6/2010 | Arai | H01L 27/105 |
| | | | 438/268 |
| 2010/0165747 A1 | 7/2010 | Mihnea et al. | |
| 2010/0207190 A1 | 8/2010 | Katsumata et al. | |
| 2010/0290289 A1 | 11/2010 | Aritome | |
| 2011/0164455 A1 | 7/2011 | Goda et al. | |
| 2012/0134215 A1 | 5/2012 | Goda | |
| 2012/0140569 A1 | 6/2012 | Goda et al. | |
| 2012/0300551 A1 | 11/2012 | Mihnea et al. | |
| 2013/0215690 A1 | 8/2013 | Goda | |
| 2014/0133239 A1 | 5/2014 | Goda | |

OTHER PUBLICATIONS

"Application Serial No. PCT/US2011/062419, International Published Application dated Jun. 7, 2012", 1 pg.

"International Application Serial No. PCT/US2011/062419, International Preliminary Report on Patentability dated Jun. 13, 2013", 8 pgs.

"International Application Serial No. PCT/US2011/062419, International Search Report dated Feb. 26, 2013", 4 pgs.

"International Application Serial No. PCT/US2011/062419, Invitation to Pay Additional Fees and Partial Search Report dated Dec. 24, 2012", 5 pgs.

"International Application Serial No. PCT/US2011/062419, Written Opinion dated Feb. 26, 2013", 6 pgs.

\* cited by examiner

MEMORY DEVICES HAVING SELECT GATES WITH P TYPE BODIES, MEMORY STRINGS HAVING SEPARATE SOURCE LINES AND METHODS

PRIORITY APPLICATION

This application is a divisional of U.S. application Ser. No. 14/159,238, filed Jan. 20, 2014, which is a divisional of U.S. application Ser. No. 13/580,043, filed Mar. 25, 2013, now issued as U.S. Pat. No. 8,634,222, which is a divisional of U.S. application Ser. No. 12/955,448, filed Nov. 29, 2010, now issued as U.S. Pat. No. 8,514,620, all of which are incorporated herein by reference in their entirety.

BACKGROUND

Higher memory density is always in demand to provide smaller devices with higher memory capacity. Forming memory devices laterally on a surface of a semiconductor chip uses a great deal of chip real estate. Improved memory devices are needed with new configurations to further increase memory density beyond traditional laterally formed memory devices.

DETAILED DESCRIPTION

Figure 1A:
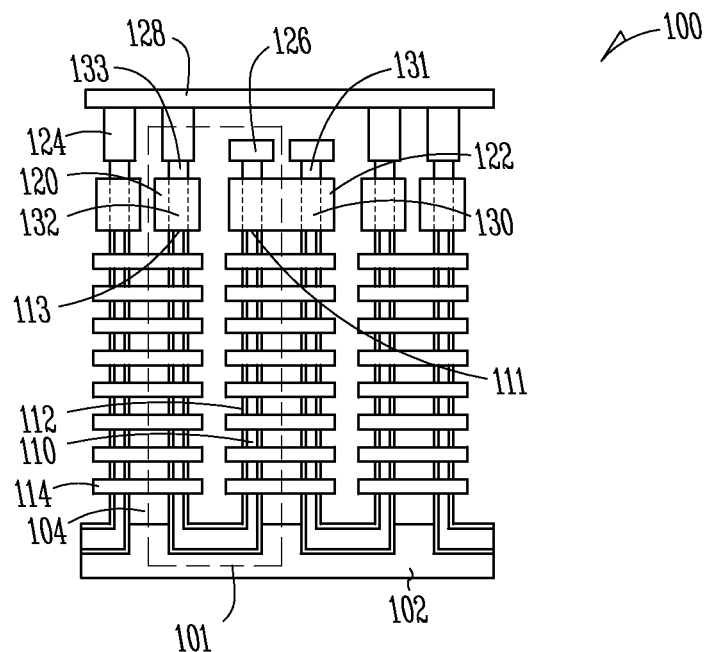
FIG. 1A shows a memory device according to an embodiment of the invention.

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical, material changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

A charge storage layer(s) 112 (e.g., a combination of a tunnel dielectric layer, a polysilicon layer, and a charge blocking layer; a combination of an oxide layer, a nitride layer, and an oxide layer; or other any other layer or combination of layers that can provide a charge storage function, whether currently known or future developed), substantially surrounds an elongated body region 110 to form a respective charge structure corresponding to each of a plurality of memory cell gates 114 (which may also substantially surround respective cross sections of the elongated body region 110 and charge storage layer(s) 112). A first select gate 120 and a second select gate 122 are shown to selectively electrically couple the elongated body region 110 to drain region 132 and a source region 130, respectively. A dielectric 104 can fill in spaces between components such as those described above.

FIG. 1A shows an embodiment of a memory device 100 where the elongated body region 110 forms a "U" shape with a pair of upward facing ends 111, 113. Another example configuration (not shown) includes a linear, vertical, elongated body region 110 with one end facing upward, and the other end facing downward. Another example configuration (not shown) includes a horizontal, linear, elongated body region 110 with ends on either side. Embodiments with two upward facing ends, 111, 113, such as the substantially "U" shaped configuration, enable easier formation of some components at the ends of the elongated body region 110 during manufacture, compared to embodiments where components are formed deeper in the structure.

In one example, the elongated body region 110 comprises n type semiconductor material, such as n– type polysilicon. A source region 130 and a drain region 132 are shown coupled to a first end 111 and a second end 113 of the elongated body region 110, respectively. In one example, the source region 130 and the drain region comprises p type semiconductor material, such as p– polysilicon. In operation, the pathway of source region 130, to elongated body region 110, to drain region 132 acts as an p-n-p transistor, with select gates 120, 122, and memory cell gates 114 operating to allow, or inhibit signal transmission along the way. In the example shown, the source region 130, elongated body region 110, drain region 132, select gates 120, 122, and memory cell gates 114 collectively form a memory cell string 101. FIG. 1A further shows that each memory cell string 101 has a separate drain select gate 120, while a source select gate 122 is shared between adjacent memory cell strings 101.

A source line 126 and a data line, such as bitline 128, are shown coupled to the source region 130 and the drain region 132 respectively. In one embodiment, a plug 124 is used to couple the bitline 128 to the drain region 132. Each of the source line 126, bitline 128 and plug 124 can comprise, consist of, or consist essentially of metal, such as aluminum, copper, or tungsten, or alloys of these or other conductor metals. In the present disclosure, the term "metal" further includes metal nitrides, or other materials that operate primarily as conductors.

The configuration of a p-n-p transistor provides a p-n junction at a source interface 111. This configuration allows charge to flow more easily from the source line 126 through the source region 130, into the elongated body region 110. In contrast, a body region in an n-p-n transistor configuration often operates as a floating body, or relies on junction breakdown to place a charge on the body region. Using such a configuration of the present disclosure, the elongated body region 110 has the ability to be biased, and operates less as a floating body element. Biasing of the elongated body region 110 can provide for reliable memory operations such as an erase operation in particular.

Figure 1B:
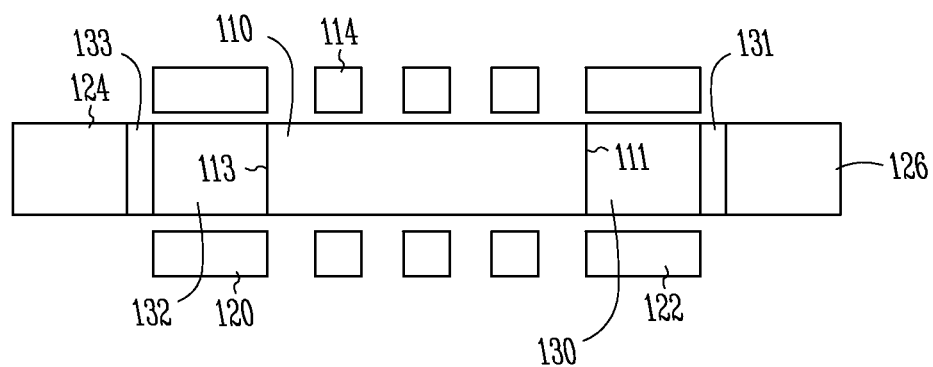
FIG. 1B shows a block diagram of a portion of the memory device from FIG. 1A according to an embodiment of the invention.

FIG. 1B shows a block diagram of memory cell string 101 from FIG. 1A. In one embodiment, a connecting region 131 is located between the source line 126 and the source region 130 and is used to couple the source line to the source region. In one embodiment, the connecting region 131 comprises a p+ doped region and forms an ohmic contact between the source line 126 and the source region 130, such that the source line 126 is ohmically coupled to the source region 130. Configurations with an ohmic contact can provide for more reliable charge transfer between the source line 126 and the source region 130, in contrast to a Schottky contact, or other diode contact. In one example, the connecting region 131 comprises p+ doped polysilicon. In selected configurations, one or more connecting regions 131, 133 are not used, in order to reduce a number of processing operations in forming the memory device 100.

In one embodiment, a second connecting region 133 is located between the plug 124 (coupled to the bit line 128) and the drain region 132, and is used to couple the drain region 132 to the bit line 128. Similar to connecting region 131, in one embodiment, the connecting region 133 comprises a p+ doped region and forms an ohmic contact between the plug 124 and the drain region 132, such that the bit line 128 is ohmically coupled to the drain region 132. In one example, the connecting region 133 comprises p+ doped polysilicon.

Figure 2A:
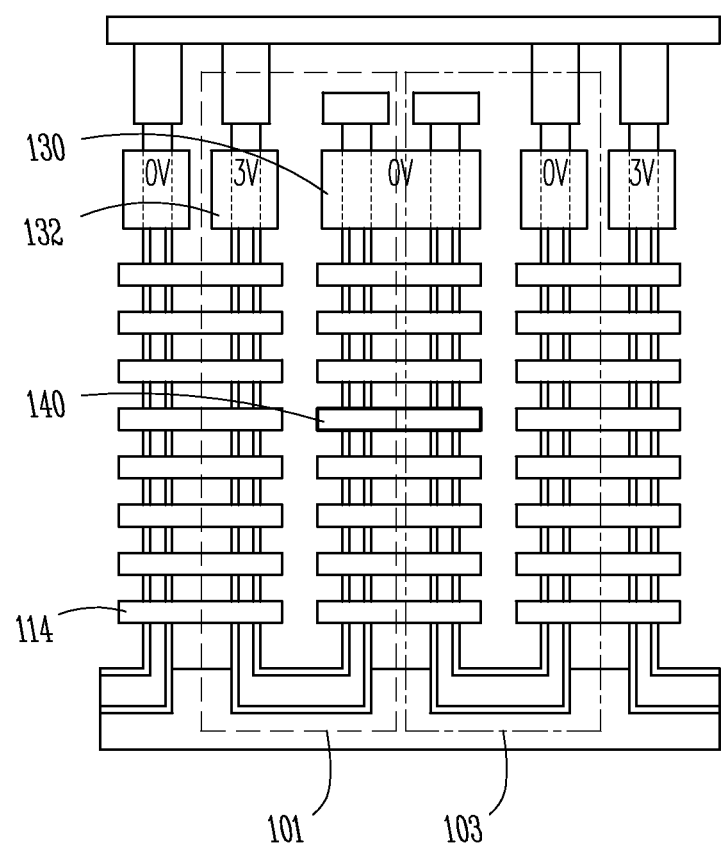
FIG. 2A shows a memory device during a programming operation according to an embodiment of the invention.
Figure 2B:
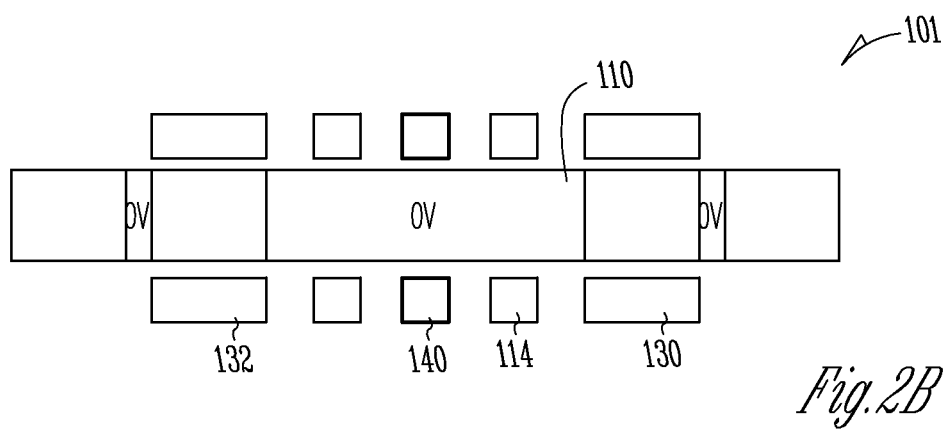
FIG. 2B shows a block diagram of a portion of the memory device from FIG. 2A for a selected memory cell string according to an embodiment of the invention.
Figure 2C:
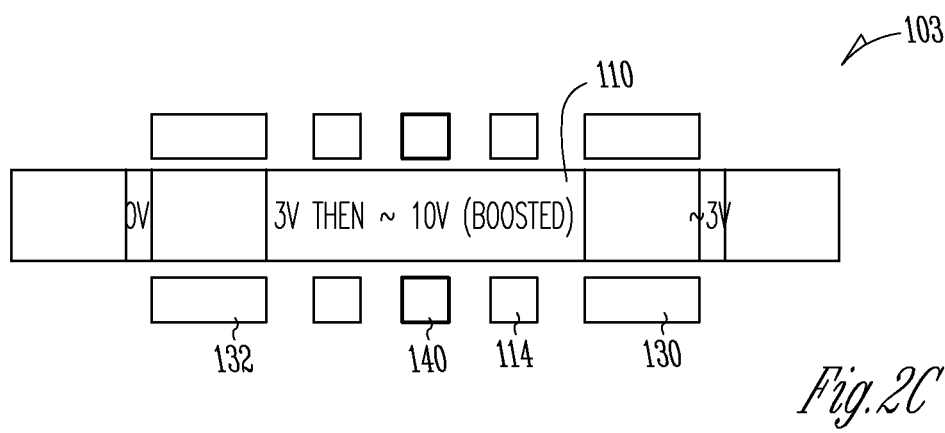
FIG. 2C shows a block diagram of a portion of the memory device from FIG. 2A for a non-selected memory cell string according to an embodiment of the invention.

FIGS. 2A, 2B and 2C illustrate an example programming operation of the memory device 100 from FIGS. 1A and 1B. A selected memory cell string 101 and a non-selected (inhibited) memory cell string 103 are shown in the memory device 100. A selected gate 140 from the plurality of memory cell gates 114 is shown being programmed.

FIG. 2B shows a block diagram of selected memory cell string 101 from FIG. 2A. In the selected memory cell string 101, the drain select gate 120 is biased to, for example, approximately 3 volts. The source select gate 122 is biased to, for example, approximately zero volts. The bit line 128 and source line 126 coupled to the selected memory cell string 101 are both biased to, for example, approximately zero volts. The plurality of memory cell gates 114 not being programmed are biased to, for example, approximately 10 volts, and the selected gate 140 is biased to a program voltage of, for example, approximately 20 volts. The potential difference between the body region 110 and the selected gate 140 (e.g., zero volts to 20 volts) is used to program charge into the charge storage structure adjacent to the selected gate 140 in the memory cell string 101.

FIG. 2C shows a block diagram of an adjacent, non-selected memory cell string 103 from FIG. 2A. In the non-selected memory cell string 103, the drain select gate 120 is biased to, for example, approximately zero volts. The source line 126 coupled to the non-selected memory cell string 103 is biased to, for example, approximately 2 volts. Accordingly, when the plurality of memory cell gates 114 not being programmed are biased to, for example, approximately 10 volts, the body region 110 is coupled up (e.g., boosted) to approximately 10 volts. In an alternative embodiment, the source line 126 can be directly biased to, for example, 10 volts. The lower potential difference between the body region 110 and the selected gate 140 in the non-selected memory cell string 103 (e.g., 10 volts to 20 volts) inhibits programming of the charge storage structure corresponding to the selected gate 140 in the non-selected memory cell string 103.

To inhibit programming a string (not shown) that shares (i.e., is also coupled to) a source line 126 and select gates 120, 122 with the selected string 101, the bit line coupled to that string is biased to, for example, approximately 2 volts. This allows the body region of that string to be boosted up to, for example, approximately 10 volts, regardless of the drain select gate or source line bias. Boosting the body region up to approximately 10 volts should inhibit programming of a charge storage structure corresponding to the selected gate 140 in such a string.

Figure 3A:
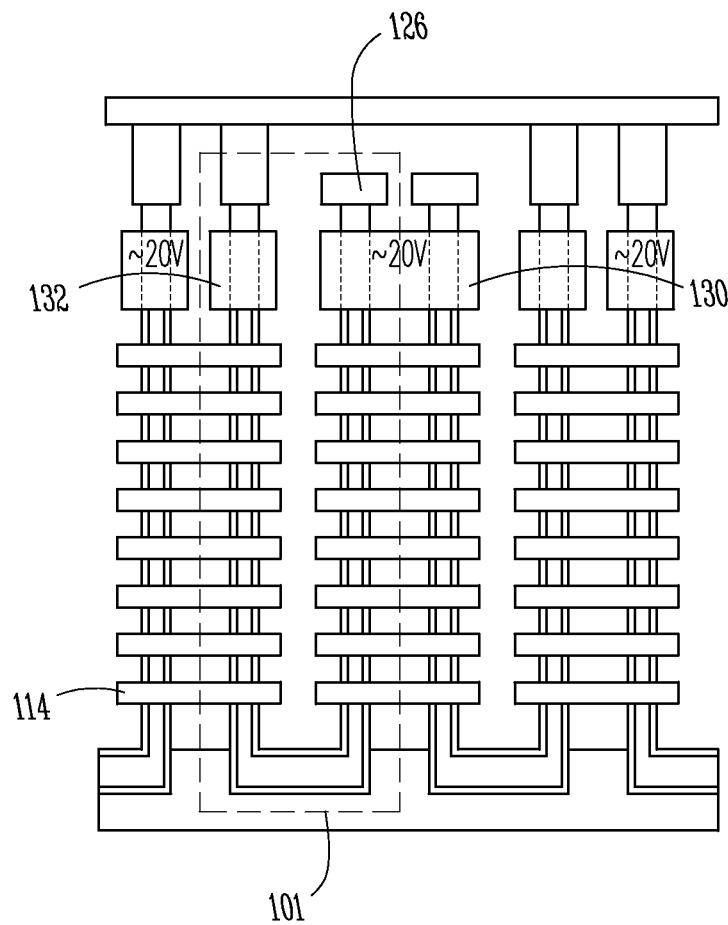
FIG. 3A shows a memory device during an erase operation according to an embodiment of the invention.
Figure 3B:
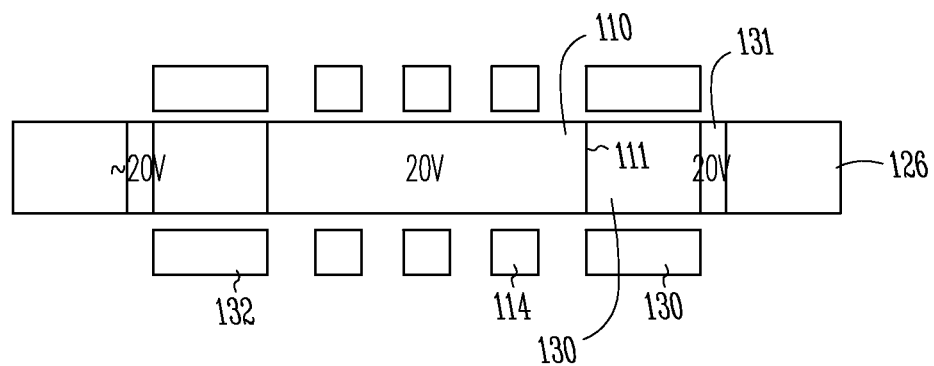
FIG. 3B shows a block diagram of a portion of the memory device from FIG. 3A according to an embodiment of the invention.

FIGS. 3A and 3B illustrate an example erase operation of the memory device 100 from FIGS. 1A and 1B. FIG. 3B shows a block diagram of memory cell string 101 from FIG. 3A. In the memory cell string 101, the select gates 120, 122 can be floated or biased to, for example, approximately 20 volts. A bit line 128 coupled to the selected string 101 can also be floated or biased to, for example, approximately 20 volts. The source line 126 coupled to the selected string is biased to an erase voltage, such as approximately 20 volts, which forward biases the body region 110 to approximately 20 volts. Alternatively, such as in an embodiment without connecting regions 131, 133, the select gates 120, 122 can be biased to a higher voltage, such that the erase voltage is transferred to the body region 110 by turning on the select gates as opposed to forward biasing. The plurality of memory cell memory cell gates 114 are biased to, for example, approximately zero volts. The potential difference between the body region 110 and the memory cell gates 114 (20 volts to zero volts) is used to erase charge from the charge storage structures adjacent to the memory cell gates 114 in the memory cell string 101.

Figure 4A:
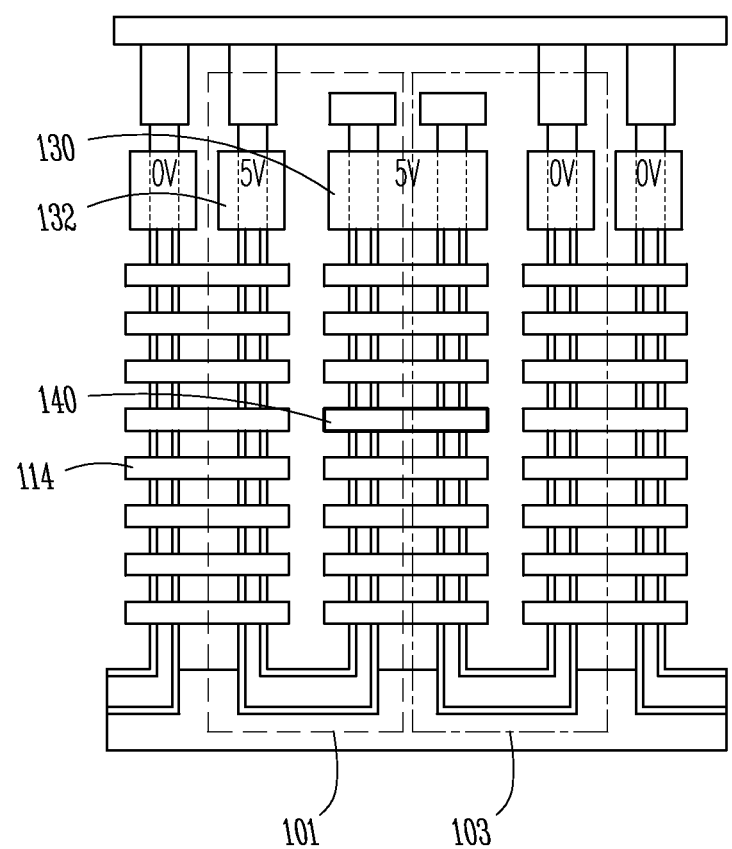
FIG. 4A shows a memory device during a read operation according to an embodiment of the invention.
Figure 4B:
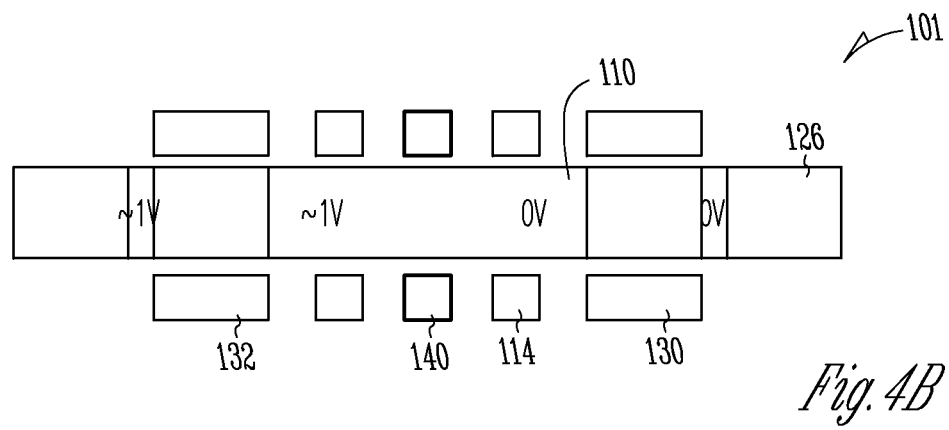
FIG. 4B shows a block diagram of a portion of the memory device from FIG. 4A for a selected memory cell string according to an embodiment of the invention.
Figure 4C:
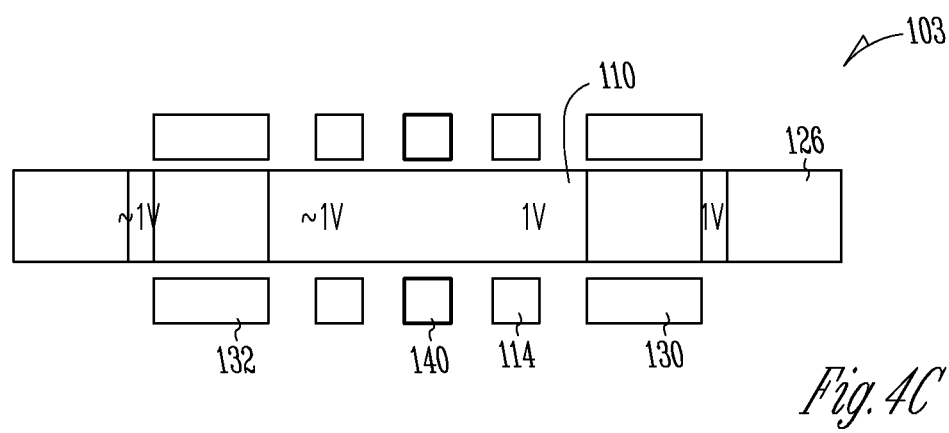
FIG. 4C shows a block diagram of a portion of the memory device from FIG. 4A for a non-selected memory cell string according to an embodiment of the invention.
Figure 5:
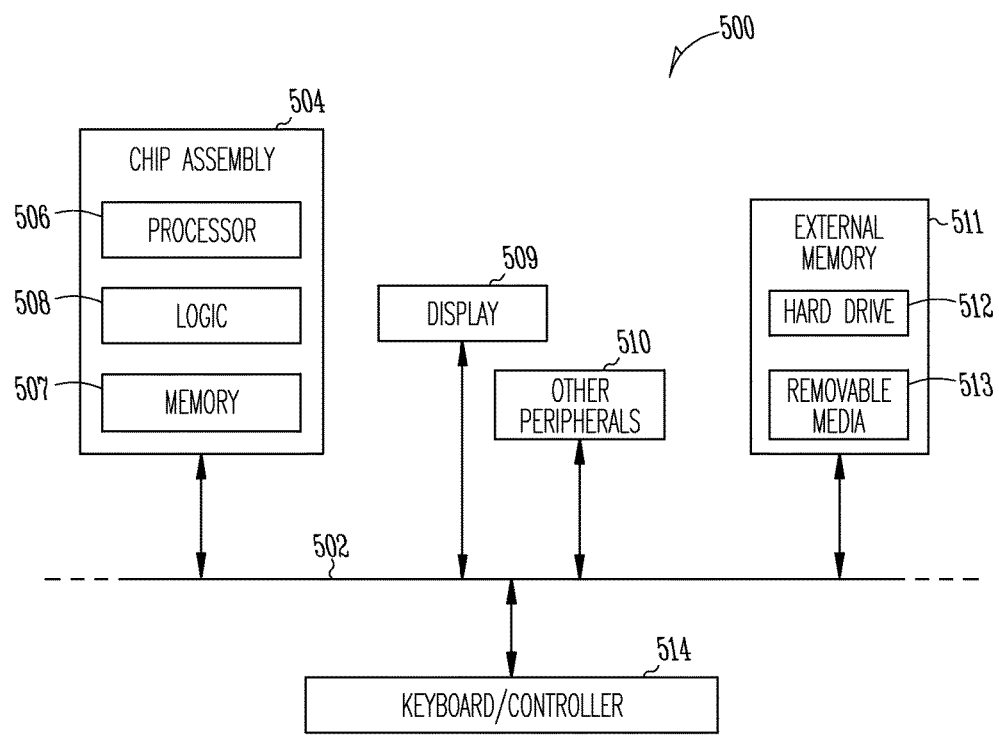
FIG. 5 shows an information handling system using a memory device according to an embodiment of the invention.

FIGS. 4A, 4B and 4C illustrate an example read operation of the memory device 100 from FIGS. 1A and 1B. A selected memory cell string 101 and a non-selected (de-selected) memory cell string 103 are shown in the memory device 100. A charge storage structure corresponding to a selected gate 140 from the plurality of memory cell gates 114 is shown being read.

FIG. 4B shows a block diagram of selected memory cell string 101 from FIG. 4A. In the selected memory cell string 101, the drain select gate 120 is biased to, for example, approximately 5 volts. The source select gate 130 is biased to, for example, approximately 5 volts. A bit line 128 coupled to the selected string 101 is precharged to, for example, approximately one volt, and a source line 126 coupled to the selected string 101 is biased to, for example, approximately zero volts. The plurality of memory cell gates 114 not being read are biased to a pass voltage(s), for example, approximately 5 volts, while the selected gate 140 is biased to a read voltage (the value of which may be dependent on the particular state being read). The pass voltage on the memory cell gates 114 allow charge to pass through the body region 110, and only the charge storage structure corresponding to the selected gate 140 is checked for its logical state (e.g., a 0, 1, or other state). The portion of the body region 110 adjacent to the selected gate 140 can be conductive (accumulated) or non conductive (fully depleted) depending on the threshold voltage of that particular cell.

FIG. 4C shows a block diagram of an adjacent, non-selected memory cell string 103 from FIG. 4A. In the non-selected memory cell string 103, the drain select gate 132 is biased to, for example, approximately zero volts (turning off that gate) and the source select gate 130 is biased to, for example, approximately 5 volts. The source line 126 coupled to the non-selected memory cell string 103 is biased to, for example, approximately one volt. As the source bias is substantially equal to the bit line bias, substantially no current flows in the non-selected string 103.

To inhibit reading a string (not shown) that shares (i.e., is also coupled to) a source line 126 and select gates 120, 122 with the selected string 101, the bit line coupled to that string is biased to (e.g., biased with or discharged to), for example, approximately 0 volts. In such a case, as the bit line bias is substantially equal to the source bias, substantially no current flows in such a string.

An example bias table is shown below in Table 1, according to an embodiment of the invention.

TABLE 1

|  | Program | Read | Erase |
| --- | --- | --- | --- |
| Bit line select | ~0 V | ~1 V | ~20 V |
| bit line deselect | ~2 V | ~0 V | N/A |
| source select | ~0 V | ~0 V | ~20 V |
| source deselect | ~2 V | ~1 V | N/A |
| wordline select | ~20 V | ~ Vref | ~0 V |
| wordline deselect | ~10 V | ~5 V | N/A |
| drain gate select | ~3 V | ~5 V | ~20 V |
| drain gate deselect | ~0 V | ~0 V | N/A |
| source gate common | ~0 V | ~5 V | ~20 V |

Another example bias table is shown below in Table 2, according to an embodiment of the invention. In one embodiment, the bias table in Table 2 is used for embodiments without p+ contacting regions such as 131 and 133 described in embodiments above.

TABLE 2

|  | Program | Read | Erase |
| --- | --- | --- | --- |
| Bit line select | ~0 V | ~1 V | ~20 V |
| bit line deselect | ~2 V | ~0 V | N/A |
| source select | ~0 V | ~0 V | ~20 V |
| source deselect | ~2 V | ~1 V | N/A |
| wordline select | ~20 V | ~ Vref | ~0 V |
| wordline deselect | ~10 V | ~5 V | N/A |
| drain gate select | ~3 V | ~5 V | ~25 V |
| drain gate deselect | ~0 V | ~0 V | N/A |
| source gate common | ~0 V | ~5 V | ~25 V |

Another example bias table for programming is shown below in Table 3, according to an embodiment of the invention.

TABLE 3

|  | Program |
| --- | --- |
| Bit line select | ~0 V |
| bit line deselect | ~10 V |
| source select | ~0 V |
| source deselect | ~10 V |

TABLE 3-continued

|  | Program |
| --- | --- |
| wordline select | ~20 V |
| wordline deselect | ~10 V |
| drain gate select | ~3 V |
| drain gate deselect | ~0 V |
| source gate common | ~0 V |

An embodiment of an information handling system such as a computer is included in FIG. 6 to show an embodiment of a high-level device application for the present invention. FIG. 6 is a block diagram of an information handling system 600 incorporating a memory device according to embodiments of the invention as described above. Information handling system 600 is merely one embodiment of an electronic system in which decoupling systems of the present invention can be used. Other examples include, but are not limited to, tablet computers, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 607 is included in the chip assembly 604. In one embodiment, the memory device 607 includes a NAND memory device according to embodiments described above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method for programming a memory cell in a selected string of memory cells, wherein the selected string is adjacent to a non-selected string, a data line is coupled to both the selected string and the non-selected string, a first source line is coupled to the selected string, and a second source line is coupled to the non-selected string, the method comprising:
   biasing the first source line to a first source voltage;
   biasing the data line to a data line voltage;
   biasing a drain select gate of the selected string to a drain select gate voltage; and
   biasing the second source line to a second source voltage, wherein the second source voltage is higher than the first source voltage, and wherein the selected string and non-selected string are both comprised of a source-body-drain configuration that is doped p-n-p, and each of the strings includes an ohmic contact between the source lines and source regions of the strings.

2. The method of claim 1, wherein biasing the first source line to a first source voltage comprises biasing the first source line to zero volts.

3. A method for programming a memory cell in a selected string of memory cells, wherein the selected string is adjacent to a non-selected string, a data line is coupled to both the selected string and the non-selected string, a first source line is coupled to the selected string, and a second source line is coupled to the non-selected string, the method comprising:
   biasing the first source line to a first source voltage;
   biasing the data line to a data line voltage;
   biasing a drain select gate of the selected string to a drain select gate voltage;
   biasing the second source line to a second source voltage, wherein the second source voltage is higher than the first source voltage, and wherein the selected string and non-selected string are both comprised of a source-body-drain configuration that is doped p-n-p; and
   wherein the non-selected string and the selected string share a same source select gate, further comprising biasing the source select gate to zero volts.

4. The method of claim 1, further comprising biasing a drain select gate of the non-selected string to zero volts.

5. The method of claim 1, further including biasing a non-selected data line to a non-selected data line voltage, wherein the second source voltage is the same as the non-selected data line voltage.

6. A method for reading a memory cell in a selected string of memory cells, wherein the selected string is adjacent to a non-selected string, a data line is coupled to both the selected string and the non-selected string, a first source line is coupled to the selected string, and a second source line is coupled to the non-selected string, the method comprising:
   biasing the first source line to a first source voltage;
   biasing the data line to a data line voltage;
   biasing a drain select gate of the selected string to a drain select gate voltage; and
   biasing the second source line to a second source voltage, wherein the second source voltage is higher than the first source voltage, and wherein the selected string and non-selected string are both comprised of a source-body-drain configuration that is doped p-n-p, and each of the strings includes an ohmic contact between the source lines and source regions of the strings.

7. The method claim 6, wherein biasing the second source line to a second source voltage comprises biasing the second source line a voltage the same as the data line voltage.

8. A method for reading a memory cell in a selected string of memory cells, wherein the selected string is adjacent to a non-selected string, a data line is coupled to both the selected string and the non-selected string, a first source line is coupled to the selected string, and a second source line is coupled to the non-selected string, the method comprising:
   biasing the first source line to a first source voltage;
   biasing the data line to a data line voltage;
   biasing a drain select gate of the selected string to a drain select gate voltage;
   biasing the second source line to a second source voltage, wherein the second source voltage is higher than the first source voltage, and wherein the selected string and non-selected string are both comprised of a source-body-drain configuration that is doped p-n-p; and
   wherein the non-selected string and the selected string share a same source select gate, further comprising biasing the source select gate to five volts.

9. The method of claim 6, further comprising biasing a drain select gate of the non-selected string to zero volts.

10. A method for programming a memory cell in a selected string of memory cells, wherein the selected string is adjacent to a non-selected string, a data line is coupled to both the selected string and the non-selected string, a first source line and a first wordline is coupled to the selected string, and a second source line and a second wordline is coupled to the non-selected string, the method comprising:
    biasing the first source line to a first source voltage;
    biasing the data line to a data line voltage;
    biasing a drain select gate of the selected string to a drain select gate voltage;
    biasing the second source line to a second source voltage at the same time as biasing the first source line to a first source voltage, wherein the second source voltage is higher than the first source voltage; and
    biasing the first wordline to a third voltage, wherein the selected string and non-selected string are both comprised of a source-body-drain configuration that is doped p-n-p, and each of the strings includes an ohmic contact between the source lines and source regions of the strings.

11. The method of claim 10, wherein biasing the first wordline to a third voltage comprises biasing the first wordline line to twenty volts.

12. The method of claim 10, wherein biasing the second wordline to a third voltage comprises biasing the second wordline line to ten volts.

13. The method of claim 10, wherein biasing the drain select gate of the selected string comprises biasing the drain select gate to three volts.

14. The method of claim 10, wherein biasing the second source line to the second source voltage comprises biasing the second source line to two volts.

15. A method for reading a memory cell in a selected string of memory cells, wherein the selected string is adjacent to a non-selected string, a data line is coupled to both the selected string and the non-selected string, a first source line and a first wordline is coupled to the selected string, and a second source line and a second wordline is coupled to the non-selected string, the method comprising:
- biasing the first source line to a first source voltage;
- biasing the data line to a data line voltage;
- biasing a drain select gate of the selected string to a drain select gate voltage;
- biasing the second source line to a second source voltage at the same time as biasing the first source line to a first source voltage, wherein the second source voltage is higher than the first source voltage; and
- biasing the first wordline to a third voltage, wherein the selected string and non-selected string are both comprised of a source-body-drain configuration that is doped p-n-p, and each of the strings includes an ohmic contact between the source lines and source regions of the strings.

16. The method of claim 15, wherein biasing the first wordline to a third voltage comprises biasing the first wordline line to a reference voltage.

17. The method of claim 15, wherein biasing the second wordline to a third voltage comprises biasing the second wordline line to five volts.

18. The method of claim 15, wherein biasing the drain select gate of the selected string comprises biasing the drain select gate to five volts.

19. The method of claim 15, wherein biasing the second source line to the second source voltage comprises biasing the second source line to one volt.

* * * * *